(12) United States Patent
Yamamoto et al.

(10) Patent No.: US 6,800,237 B1
(45) Date of Patent: Oct. 5, 2004

(54) METHOD FOR MACHINING CERAMIC GREEN SHEET

(75) Inventors: Takahiro Yamamoto, Omihachiman (JP); Hiroshi Komatsu, Omihachiman (JP); Tadashi Morimoto, Hikone (JP); Takashi Shikama, Yokaichi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/539,691

(22) Filed: Mar. 31, 2000

(30) Foreign Application Priority Data

| Apr. 2, 1999 | (JP) | 11-095770 |
| Apr. 2, 1999 | (JP) | 11-095771 |
| Apr. 2, 1999 | (JP) | 11-095772 |
| Apr. 2, 1999 | (JP) | 11-095774 |

(51) Int. Cl.$^7$ .................................... B23K 26/067
(52) U.S. Cl. ............... 264/400; 264/482; 219/121.71; 219/121.74; 219/121.75; 219/121.76
(58) Field of Search .................. 264/400, 482, 264/156, 154; 219/121.7, 121.71, 121.72, 121.73, 121.74, 121.75, 121.76

(56) References Cited

U.S. PATENT DOCUMENTS

| 3,742,182 A | * | 6/1973 | Saunders ................ 219/121.7 |
| 3,770,529 A | * | 11/1973 | Anderson .................... 156/3 |
| 5,055,653 A | * | 10/1991 | Funami et al. .......... 219/121.75 |
| 5,293,025 A | * | 3/1994 | Wang .................... 219/121.71 |
| 5,362,940 A | * | 11/1994 | MacDonald et al. ... 219/121.68 |
| 5,367,143 A | * | 11/1994 | White, Jr. .............. 219/121.68 |
| 5,939,010 A | * | 8/1999 | Yuyama et al. ............. 264/400 |
| 5,948,200 A | * | 9/1999 | Nakazawa et al. .......... 156/248 |
| 6,008,468 A | * | 12/1999 | Tanaka et al. .......... 219/121.71 |
| 6,172,330 B1 | * | 1/2001 | Yamamoto et al. ....... 219/121.7 |
| 6,285,001 B1 | * | 9/2001 | Fleming et al. ......... 219/121.72 |

FOREIGN PATENT DOCUMENTS

| JP | 56-105698 | | 8/1981 |
| JP | 62-13120 | | 3/1987 |
| JP | 2-58292 | | 2/1990 |
| JP | 2-117791 | | 5/1990 |
| JP | 7-193375 | | 7/1995 |
| JP | 8-33993 | | 2/1996 |
| JP | 9-260846 | | 10/1997 |
| JP | 10-34365 | | 2/1998 |
| JP | 07-193375 | * | 6/1998 |
| JP | 10-242617 | | 9/1998 |
| JP | 3458759 | | 8/2003 |
| TW | 84104650 | | 5/1995 |
| WO | WO 00/53365 A | | 9/2000 |

OTHER PUBLICATIONS

Derwent 1988–159505, "Debris Reduction for Laser Drilling of Green Ceramic Sheets", 1988.*

* cited by examiner

Primary Examiner—Stefan Staicovici
(74) Attorney, Agent, or Firm—Keating & Bennett, LLP

(57) ABSTRACT

A plurality of feedthrough holes are efficiently formed on the present invention by splitting a laser beam emitted from a laser source into plural laser beams by allowing the beam to pass through a diffraction grating, followed by simultaneously forming a plurality of the feedthrough holes on the ceramic green sheet by irradiating the ceramic green sheet with the split laser beam.

13 Claims, 12 Drawing Sheets

METHOD FOR MACHINING CERAMIC GREEN SHEET

BACKGROUND OF THE INVENTION

1. Field of the Invention

The present invention relates to a method for machining a ceramic green sheet to be used in manufacturing laminated ceramic electronic components, and an apparatus for machining the same. In more detail, the present invention relates to a method for machining a ceramic green sheet for forming a plurality of feedthrough holes (for example, the holes that serve as a via-hole and through-hole), and an apparatus for machining the same.

2. Description of the Related Art

Internal electrodes laminated and disposed via ceramic layers (interlayer electrodes) are usually put into electrical continuity through via-holes (feedthrough holes) in various laminated ceramic electronic components such as laminated coil components, laminated substrates and the like.

The via-holes (feedthrough holes) have been formed by punching the ceramic green sheet using a die and a pin.

However, the die-cut method described above involves the following problems:

1. High dimensional and configurational accuracies of the die and pin are required since they largely affect the accuracy of the feedthrough hole, thus inevitably increasing the facility cost;

2. The die and pin have short service life requiring a periodic exchange which is expensive, and takes a long time;

3. The die and pin should be exchanged in every change of the shape of a product or the machining portions. Further time consuming precise adjustment is required after exchanging the die and pin; and 4. Machining accuracy (configurational accuracy) is decreased as the size of the feedthrough hole becomes fine.

For solving the above problems, a method (a laser machining method) has been proposed and a part of the method has been practically used today, whereby fine feedthrough holes with a size as small as about 80 μm can be formed within a desired area on the ceramic green sheet with high configurational and positional accuracies.

While different sites on the ceramic green sheet have been machined (to form feedthrough holes) in a sequence by allowing a table holding a galvano-scan mirror and green sheet to travel in the conventional machining method using a laser beam, the machining rate is determined by oscillation frequency of the laser beam, scanning speed of the galvano-scan mirror and travel speed of the table all of which serve to restrict improved machining rate.

The machining rate when the laser machining method is used is considerably slow as compared with the machining rate in the method using the die and pin, the former being usually one several and often one tenth of the latter.

Although a method for simultaneously forming several feedthrough holes using YAG laser has been proposed for improving the machining rate in the laser machining method, the method also involves the following problems:

1. A large part of the laser energy is lost in a shunt for splitting the laser beam and in the laser beam transmission system after passing through the shunt. The number of the split beams can not be sufficiently increased since only 30 to 50% of the energy emitted from the laser oscillator is utilized; and 2. Expensive materials should be used for a YAG laser absorber when the ceramic green sheet has a composition with a low YAG laser absorbance.

Although other machining methods for simultaneously forming a plurality of the feedthrough holes on the ceramic green sheet, such as an image transfer method taking advantage of YAG laser and $CO_2$ laser, or a method using a mask having a given transmission pattern, have been proposed, these methods also involve the following problems:

1. The number of holes that are simultaneously formed cannot be sufficiently increased because only 10 to 30% of the laser energy emitted from the laser oscillator is effectively utilized; and 2. The image focusing mask and image transfer mask are so liable to be damaged with the laser beam that high precision machining is not secured.

In compliance with recent requirements of compacting and high degree of integration of electronic components, the diameter of the via-holes to be formed on the ceramic green sheet is required to be fine.

However, machining precision (configurational accuracy) in is decreased as the hole diameter (hole size) is reduced as hitherto described when the punching method is used.

Forming the feedthrough holes with high configurational and dimensional accuracies also turns out to be difficult when the hole diameter (hole size) is reduced to 50 μm or less in the laser machining method making use of YAG laser and $CO_2$ laser. Therefore, the minimum hole diameter available has been considered to be about 30 μm. This is because clear focusing becomes difficult when the laser wavelength approaches the minimum hole diameter in the laser machining making use of a YAG laser and a $CO_2$ laser.

The output energy of the laser oscillator is adjusted to be suitable for forming fine feedthrough holes in the conventional laser machining method, because the output energy of the laser oscillator is related to the laser beam width as shown in FIG. 6. While the laser beam irradiated to the ceramic green sheet is required to have a width d when fine holes with, a diameter of d is formed, the laser beam energy at an output level of the conventional laser oscillator is so large that the laser beam width turns out to be larger than the hole diameter d of the feedthrough hole to be formed on the ceramic green sheet, failing to form the feedthrough holes having a desired hole diameter d. Focused width at the energy required for perforation is larger than the laser beam width to form the hole diameter d of the feedthrough hole. Therefore, the laser beam width should be reduced to correspond to the desired feedthrough hole diameter d by decreasing the output energy of the laser oscillator.

However, a stable laser oscillation is not possible when the output energy of the laser oscillator is lowered to reduce the laser beam width to a level corresponding to the feedthrough hole diameter d. Consequently, it is difficult to form fine feedthrough holes with high configurational and dimensional accuracies due to instability of machining qualities.

As shown in FIG. 15 when a ceramic green sheet one face of which is supported with a carrier film is punched by the method described above, a feedthrough hole 52a is formed through the carrier film 52 besides forming a feedthrough hole 51a through the ceramic green sheet 51. A conductive paste 54 is applied through the feedthrough hole 52a on the carrier film 52 as shown in FIG. 16 and adheres on a table 53 supporting the ceramic green sheet 51, when the conductive paste is printed by a screen printing method for forming interlayer connection and wiring patterns in the post-machining process. The conductive paste 54 adhered on the table 53 is left behind on the table 53 as shown in FIG. 17 to deteriorate the accuracy of the screen printing, or causes poor quality of the ceramic green sheet by adhesion of the paste to the succeeding green sheets. Therefore, cleaning of the table is required after screen printing each layer of the ceramic green sheet, decreasing the manufacturing efficiency of the ceramic green sheet.

As shown in FIG. 18 peeling of internal conductors (conductive paste) 54 in the feedthrough holes 51a and 52a also causes poor quality, when the carrier film 52 is peeled off from the ceramic green sheet 51 after the ceramic green sheet 51 has been lifted up from the table 53 together with the carrier film 53.

For solving the problems as described above, a method (a laser machining method) has been proposed and put into practical application (Japanese Unexamined Patent Application Publication No. 7-193375), by which a feedthrough hole that does not perforate through the carrier film but perforates only through the ceramic green sheet can be formed using a laser beam within a desired area on the ceramic green sheet one face of which is supported with a carrier film.

However, the conventional laser machining method yet involves the following problems when it is applied for the method as described above:

1. The output energy of the laser oscillator should be suppressed in order to adjust the laser beam energy to a level not to form feedthrough holes through the carrier film, making repeated and stable machining difficult; and 2. Improvement of, machining rate is restricted since it is determined by the oscillation frequency of the laser oscillator, scanning speed of the galvano-mirror and travel speed of the table (the machining rate when the laser machining method is used is considerably slow as compared with the machining rate in the method using the die and pin, the former being usually one several and often one tenth of the latter).

SUMMARY OF THE INVENTION

Accordingly, the object of the present invention for solving the foregoing problems is to provide a method and an apparatus for machining a ceramic green sheet that are able to effectively form a plurality of feedthrough holes on the ceramic green sheet.

For attaining the object described above, there is provided in accordance with one aspect of the present invention a method for machining a ceramic green sheet for forming a plurality of feedthrough holes on the ceramic green sheet, comprising the steps of: allowing a laser beam emitted from a laser source to pass through a diffraction grating to split the beam into plural laser beams; and simultaneously form a plurality of feedthrough holes within a desired area on the ceramic green sheet by irradiating the split laser beams onto the ceramic green sheet.

The plural feedthrough holes can be effectively formed on the ceramic green sheet by irradiating the laser beams onto the ceramic green sheet without using any masks, after allowing the laser beam emitted from a laser source to pass through a diffraction grating to split the beam into plural laser beams.

The phrase "splitting the laser beam into plural laser beams by allowing the laser beam to pass through a diffraction grating" corresponds to a concept meaning that the laser beam is split so that its shape on the irradiation face of a machining object turns out to be a pattern corresponding to the plane view of the feedthrough holes to be formed, and actual shape of the hole is not particularly restricted.

In an another aspect, the present invention provides a method for machining a ceramic green sheet for forming a plurality of feedthrough holes having the same shape and size on the ceramic green sheet, wherein a laser beam emitted from a laser source passes through a diffraction grating which splits the laser beam into plural laser beams having a uniform shape and size corresponding to the shape and size of feedthrough holes to be formed. The laser beams uniformly split into plural beams are irradiated onto the ceramic green sheet to simultaneously form a plurality of feedthrough holes having a uniform shape and size on the ceramic green sheet.

Plural feedthrough holes with a uniform shape and size can be efficiently formed on the ceramic green sheet by irradiating the ceramic green sheet with laser beams uniformly split into plural beams, after allowing the laser beam to pass through a diffraction grating to split a laser beam emitted from a laser source into plural laser beams having a uniform shape and size corresponding to the shape and size of the feedthrough holes.

The laser beam includes (1) a laser beam only passing through the diffraction grating (0-th light), (2) a laser beam split with the diffraction grating, and (3) noise (higher degree laser beams) that are a kind of loss derived from the limitation of the machining accuracy when splitting a laser beam, by passing through the diffraction grating, and these three kinds of the laser beams are irradiated on the machining object. Individual energy level of the higher degree laser beams, or noise, is low and the machining object is little affected by the individual noise energy. However, the total noise energy turns out to be large because the number of the laser beams that serve as the noise is larger than the number of the split beams, and the former increases in proportion to the number of the split beams, thereby the total energy of the noise beams turns out to be large.

The laser beam passing through the diffraction grating (0-th light) is not split with the diffraction grating, but only passes through, thereby having a higher energy than the laser beams split with the diffraction grating (as is described at (2)above). Since noises (higher degree laser beams) are generated during splitting of the beam with the diffraction grating, the energy of the split laser beams turns out to be smaller then the expected laser beam energy.

Owing to these factors, as shown in FIG. 4 the diameter of the feedthrough hole 15 (15a) formed at the center of the sheet becomes larger than the diameter of the holes 15 formed at the periphery of the sheet, when the sheet is machined using the laser beam split with the diffraction grating. Therefore, it is impossible to form the feedthrough holes on the ceramic green sheet 10 with a uniform shape and size.

The diffraction grating is machined with high accuracy in order to suppress generation of the higher degree laser beam as one of, the splitting losses as low as possible. In addition, the energy threshold level required for machining the machining object is determined by preliminary experimentation, and the diffraction grating is designed so that the diameter of the laser beam can be increased by reducing the energy density of the split laser beam within the range greater than the lower limit of the machining threshold level. Plural laser beams having a uniform shape and size corresponding to the shape and size of the feedthrough holes to be formed can be thus obtained as disclosed in the present invention, by splitting the laser beam using the diffraction grating as described above. Machining using the laser beam obtained as described above allows the feedthrough hole 15 (15*a*) at the center of the sheet as well as the plural feedthrough holes 15 at the periphery of the sheet, which have a uniform shape and size as shown in FIG. 5 to be securely and efficiently formed on the ceramic green sheet 10.

A small quantity of the energy is lost by allowing the laser beam to pass through the diffraction grating when the diffraction grating is used for splitting the laser beam (while splitting a beam using the conventional shunt causes an energy loss of about 50 to 70%, the present invention enables the loss to be reduced to about 20%). Therefore, a lot of the feedthrough holes can be simultaneously formed by splitting the laser beam into a number of beams by allowing the beam to pass through the diffraction grating, thus making it possible to form many feedthrough holes within a desired area with high efficiency and accuracy.

In a different aspect, the present invention provides a method for machining a ceramic green sheet comprising: allowing a laser beam emitted from a laser source to pass through a diffraction grating; splitting the laser beam into plural laser beams having an energy suitable for forming fine holes with a hole diameter of 50 $\mu$m or less on the ceramic greens sheet; and forming a plurality of fine holes with a diameter of 50 $\mu$m or less by irradiating the laser beams split into plural beams onto the ceramic green sheet.

A plurality of fine holes with a hole diameter of 50 $\mu$m or less can be efficiently formed on the ceramic green sheet, by allowing the laser beam emitted from the laser source to pass through the diffraction grating to split the beam into plural laser beams having an energy suitable for forming fine holes with a hole diameter of 50 $\mu$m or less on the ceramic greens sheet, followed by irradiating the laser beams split into plural beams onto the ceramic green sheet.

According to the method of the present invention, as shown in FIG. 7 a high energy level laser beam 2 (see FIG. 8A) is split into plural laser beams 2*a* using the diffraction grating 3, the energy of each split laser beam 2*a* can be attenuated to a level suitable for forming fine holes (or to a level for making the width of the laser beam to correspond to the hole diameter d of the fine hole, see FIG. 8B), thereby enabling the laser oscillator to be operated at a stable output level. Consequently, the fine holes with a hole diameter of 50 $\mu$m or less can be efficiently formed with a high positional and configurational accuracies.

The phrase "splitting the laser beam into plural laser beams having an energy suitable for forming fine holes with a hole diameter of 50 $\mu$m or less on the ceramic green sheet" as used in the present invention refers to a concept meaning that the width of individual laser beam to be irradiated onto the ceramic green sheet is adjusted to be 50 $\mu$m or less by allowing the individual laser beam energy level to be reduced by splitting the laser beam with the diffraction grating. However, the absolute energy level is appropriately determined depending on the composition of the ceramic green sheet, and on the dimension and size of the fine holes to be formed.

The fine holes as used in the present invention refers to a concept including, not only perforated holes (feedthrough holes), but also holes with one end closed, not perforated and partial feedthrough holes in which a part of the hole is penetrated and other part of the hole is not penetrated.

According to the method for machining a ceramic green sheet of the present invention, the ceramic green sheet may be irradiated with the laser beam while allowing the ceramic green sheet to travel.

A plurality of feedthrough holes may be efficiently formed within a different area on the ceramic green sheet by irradiating the ceramic green sheet with the laser beam while allowing the ceramic green sheet to travel.

According to the method for machining a ceramic green sheet of the present invention, the ceramic green sheet may be also irradiated with the laser beam while allowing the ceramic green sheet to intermittently travel.

A plurality of the feedthrough holes may be efficiently formed with high configurational and positional accuracies by allowing the ceramic green sheet to intermittently travel to irradiate the ceramic green sheet with the laser beam while the ceramic green sheet is stationary.

Also, according to the method for machining a ceramic green sheet of the present invention, the laser beam emitted from the laser source may be a pulse laser beam.

Efficiently forming a plurality of the feedthrough holes with high configurational and positional accuracy is enabled even when the laser beam is irradiated while allowing the ceramic green sheet to intermittently travel, by irradiating a pulse laser beam, thereby enabling the present invention to be more effectively applied.

The method for machining a ceramic green sheet as described above allows a plurality of feedthrough holes to be formed with a uniform shape and size, besides allowing a plurality of fine holes with a hole diameter of 50 $\mu$m or less to be formed.

In a further different aspect, the present invention provides a method for machining a ceramic green sheet for forming a plurality of feedthrough holes on the ceramic green sheet, comprising the steps of: disposing a laser source for emitting a pulse laser beam, a diffraction grating for splitting the laser beam into plural laser beams, a galvano-scan mirror for allowing the laser beam to reflect with a predetermined reflection angle, a converging lens for individually converging the laser beams reflected from the galvano-scan mirror, and the ceramic green sheet so as to be arranged in a predetermined position; allowing the laser beam emitted from the laser source to pass through the diffraction grating; splitting the beam into plural laser beams; irradiating the ceramic green sheet with the split pulse laser beams by reflecting the beam with a galvano-scan mirror to simultaneously form a plurality of feedthrough holes within a desired area on the ceramic green sheet; and repeatedly irradiating the ceramic green sheet with the laser beam by changing reflection angles of the galvano-scan mirror to form a plurality of feedthrough holes within a different predetermined area on the ceramic green sheet.

A plurality of the feedthrough holes can be formed within a desired area on the ceramic green sheet without allowing the ceramic green sheet to travel, by repeating irradiation of the laser beam onto the ceramic green sheet by changing the reflection angle of the galvano-scan mirror.

In a further different aspect, the present invention provides a method for machining a ceramic green sheet for forming a plurality of feedthrough holes on a ceramic green sheet, comprising the steps of: disposing a laser source for emitting a pulse laser beam, a galvano-scan mirror for allowing the laser beam to reflect at a predetermined angle, a diffraction grating for splitting the laser beam into plural laser beams, a converging lens for individually converging the laser beams split into plural beams, and the ceramic green sheet so as to be arranged in a predetermined position;

allowing the pulse laser beam emitted from the laser source; reflecting the beam with the galvano-scan mirror; allowing the laser beam to pass through the diffraction grating to split the beam reflected by the galvano-scan mirror into plural laser beams; irradiating the ceramic green sheet with the split pulse laser beams to simultaneously form a plurality of feedthrough holes within a desired area on the ceramic green sheet; and repeatedly irradiating the ceramic green sheet with the laser beam by changing the reflection angle of the galvano-scan mirror to form a plurality of the feedthrough holes within a different area on the green sheet.

According to the method for machining the ceramic green sheet described above, the split laser beam is irradiated onto the ceramic green sheet by allowing the beam to reflect with the galvano-scan mirror, after splitting the laser beam into plural laser beams by passing the beam through the diffraction grating. Otherwise, it is also possible to split the laser beam into plural beams after reflecting the beam with the galvano-scan mirror. The latter method also brings about the same advantages as in the former method.

According to the method for machining a ceramic green sheet of the present invention, the pulse laser beam may be repeatedly irradiated while allowing the ceramic green sheet to travel.

The laser beam is repeatedly irradiated onto the ceramic green sheet by changing its reflection angle with the galvano-scan mirror in the present invention as hitherto described. Otherwise, a plurality of the feedthrough holes can be securely formed on arbitrary sites within the wide area of the ceramic green sheet without any positional limitation by allowing the ceramic green sheet to travel, thereby the present invention may be more effectively applied.

The method for machining the ceramic green sheet as hitherto described comprises using a diffraction grating for allowing in the laser beam to pass through to split the laser beam into plural beams having the same shape and dimension as the shape and dimension of the feedthrough holes to be formed, whereby the laser beam is split into plural laser beams having the same shape and dimension corresponding to the shape and size of the feedthrough holes to be formed after passing through the diffraction grating to simultaneously form a plurality of feedthrough holes having a uniform shape and dimension.

The method for machining the ceramic green sheet described above comprises using a fraction grating for allowing the laser beam to pass through to split the beam into plural beams having an energy suitable for forming fine holes with a hole diameter of 50 $\mu$m or less, whereby the laser beam is split into plural laser beams having an energy suitable for forming fine holes with a hole diameter of 50 $\mu$m or less to form a plurality of the fine holes with a hole diameter of 50 $\mu$m or less.

Preferably, the present invention provides a method for machining a ceramic green sheet, wherein the diffraction grating is made of a material having a high transmittance against the laser beam.

The energy efficiency can be improved by using a material having a high transmittance against the laser beam for the optical system, particularly for the diffraction grating, thereby enabling a plurality of the feedthrough holes to be formed with high efficiency on the ceramic green sheet.

The laser emitted from the laser source may be a $CO_2$ laser in the method for machining a ceramic green sheet according to the present invention.

Since the $CO_2$ laser has a low absorbance against the ceramic itself constituting the ceramic green sheet, and variations of characteristics due to deterioration of the ceramic itself can be prevented, the $CO_2$ laser is preferably used in the method for machining a ceramic green sheet according to the present invention.

Although the $CO_2$ laser is hardly absorbed by the ceramic constituting the ceramic green sheet as described above, the ceramic green sheet can be efficiently machined (removed) using the $CO_2$ laser, when a material having a high absorbance against the $CO_2$ laser is blended in a binder constituting the ceramic green sheet.

The ceramic green sheet may be a green sheet provided with a carrier film supporting one face of the ceramic green sheet in the method for machining a ceramic green sheet according to the present invention.

The present invention is also applicable for the machining of the ceramic green sheet provided with a carrier film (usually a resin film) supporting one face of the ceramic green sheet. When the ceramic green sheet provided with a carrier film is machined, dimensional and positional accuracies of the feedthrough holes may be improved by suppressing deformation and distortion of the ceramic green sheet from generating, since the ceramic green sheet can be treated while it is supported with the carrier film.

In a further different aspect, the present invention provides an apparatus for machining a ceramic green sheet comprising: a support member for supporting the ceramic green sheet; a travel member for allowing the ceramic green sheet to travel along a given direction; a laser source; a diffraction grating for allowing the laser beam emitted from the laser source to pass through to split the laser beam into plural laser beams; and a converging lens for individually converging the laser beams split into plural beams after passing through the diffraction grating and irradiating the laser beams onto the ceramic green sheet supported with the support member.

An apparatus for machining a ceramic green sheet to be used in the present invention preferably comprises a support member for supporting the ceramic green sheet, a travel member for allowing the ceramic green sheet to travel along a given direction, a laser source, a diffraction grating for allowing the laser beam emitted from the laser source to pass through to split the laser beam into plural laser beams, and a converging lens for individually converging the laser beams split into plural beams. Accordingly, the ceramic green sheet can be efficiently machined by securely applying the machining method according to the present invention to form a plurality of the feedthrough holes.

A variety of travel member for allowing the ceramic green sheet to travel along a given direction may be used in such a manner that the ceramic green sheet travels by allowing a support member supporting the ceramic green sheet to travel along a given direction, or the ceramic green sheet itself is allowed to directly travel.

In a further different aspect, the present invention provides an apparatus for machining a ceramic green sheet comprising: a support member for supporting the ceramic green sheet; a laser source; a diffraction grating for allowing the laser beam emitted from the laser source to pass through to split the laser beam into plural laser beams; a galvano-scan mirror for reflecting at a given reflection angle each laser beam after passing through the diffraction grating and being split into plural beams; a galvano-mirror driving member for changing the reflection angle of the galvano-scan mirror; and a converging lens for individually converging the laser beams split into plural beams after being reflected with the galvano-scan mirror at a given angle and irradiating each laser beam onto the ceramic green sheet supported with the support member.

The laser beams split into plural beams by passing through the diffraction grating are irradiated onto the ceramic green sheet after allowing the beams to reflect with the galvano-scan mirror while repeatedly irradiating the laser beams onto the ceramic green sheet by changing the reflection angle of the galvano-scan mirror. Consequently, a plurality of the feedthrough holes may be formed on plural sites within a predetermined area on the ceramic green sheet without allowing the ceramic green sheet to travel, thereby allowing the present invention to be more practical.

In a further different aspect, the present invention provides an apparatus for machining a ceramic green sheet comprising: a support member for supporting the ceramic green sheet; a laser source; a galvano-scan mirror for allowing the laser beam to reflect at a given angle; a galvano-scan mirror driving member for changing the reflection angle of the galvano-scan mirror; a diffraction grating for allowing the laser beam reflected by the galvano-scan mirror at a given angle to pass through and splitting the laser beam into plural laser beams; and a converging lens for individually converging the laser beams split into plural beams after passing through the diffraction grating and irradiating each laser beam onto the ceramic green sheet supported with the support member.

The laser beam reflected at a given angle with the galvano-scan mirror is irradiated onto the ceramic green sheet, while changing the reflection angle of the galvano-scan mirror to repeatedly irradiate the laser beam onto the ceramic green sheet. Consequently, a plurality of the feedthrough holes may be formed on plural sites within a predetermined area of the ceramic green sheet without allowing the ceramic green sheet to travel, making the present invention to be more practical.

A travel member for allowing the ceramic green sheet to travel along a given direction may be provided in an apparatus for machining a ceramic green sheet according to the present invention.

The laser beam is repeatedly irradiated onto the ceramic green sheet in the machining apparatus as described above, by changing the reflection angle using the galvano-scan mirror. Otherwise, a plurality of the feedthrough holes may be securely formed at arbitrary sites in a wide area on the ceramic green sheet without any positional restrictions by allowing the ceramic green sheet to travel, thus enabling the present invention to be more practical.

The apparatus for machining a ceramic green sheet according to the present invention comprises a diffraction grating for splitting a laser beam into plural laser beams having a uniform shape and size corresponding to the shape and size of the feedthrough holes to be formed by allowing the laser beam to pass through the diffraction grating, whereby the laser beam is split into plural beams having a uniform shape and size corresponding to the shape and size of the feedthrough holes by allowing the laser beam to pass through the diffraction grating to form a plurality of the feedthrough holes having a uniform shape and size.

The apparatus for machining a ceramic green sheet as described above comprises a diffraction grating for splitting the laser beam into plural laser beams having an energy suitable for forming fine holes with a hole diameter of 50 $\mu$m or less on the ceramic green sheet by allowing the laser beam to pass through the diffraction grating, whereby the laser beam is split into plural beams having an energy suitable for forming fine holes with a hole diameter of 50 $\mu$m or less on the ceramic green sheet by allowing the laser beam to pass through the diffraction grating to form plural fine holes with a hole diameter of 50 $\mu$m or less.

In a further different aspect, the present invention provides a method for machining a ceramic green sheet for forming a plurality of feedthrough holes on the ceramic green sheet one face of which is supported with a carrier film, comprising: splitting a pulse laser beam emitted from a laser source into plural laser beams by allowing the laser beam to pass through a diffraction grating so that each split laser beam perforates through the ceramic green sheet but does not perforate through the carrier film; and forming a plurality of feedthrough holes on the ceramic green sheet by irradiating the split plural pulse laser beams on one face of the ceramic green sheet that is not supported with the carrier film.

The pulse laser beam emitted from the laser source is split into plural beams, having such an energy as to perforate through the ceramic green sheet but not perforate through the carrier film, by allowing the beam to pass through the diffraction grating. The laser beams split into plural beams are irradiated onto the face of the ceramic green sheet not supported with the carrier film; thereby enabling the feedthrough holes to be securely formed on the ceramic green sheet without allowing the beam to perforate through the carrier film.

The phrase "split into plural beams having such an energy as to perforate through the ceramic green sheet but not perforate through the carrier film" as used in the present invention refers to a concept meaning that the laser beam is split so that the beam has an energy to an extent that the laser beam perforates through the ceramic green sheet along the direction of thickness when the laser beam is irradiated on the ceramic green sheet side, but the feedthrough holes are not formed in the carrier film.

According to the method of the present invention, the output energy of the laser oscillator is not required to be reduced, since the laser beam is split with the diffraction grating so that the energy level of individual split laser beam is lowered to a given level as described above. Consequently, the laser oscillator is enabled to be operated at a stable output level, making secure machining possible to form the feedthrough holes only through the ceramic green sheet without allowing the beam to perforate through the carrier film.

Preferably, the laser beam is irradiated while allowing the ceramic green sheet to travel in the method for machining a ceramic green sheet according to the present invention, wherein one face of the ceramic green sheet is supported with the carrier film.

A plurality of the feedthrough holes may be efficiently formed within a different area on the ceramic green sheet without allowing the beam to perforate through the carrier film, by irradiating the laser beam while allowing the ceramic green sheet to travel.

In a further different aspect, the present invention provides a method for machining a ceramic green sheet for forming a plurality of feedthrough holes on a ceramic green sheet one face of which is supported with a carrier film, comprising the steps of: disposing a laser source for emitting a pulse laser beam, a diffraction grating for splitting the laser beam into plural laser beams, a galvano-scan mirror for allowing the laser beam to reflect at a given angle, a converging lens for individually converging the laser beams split into plural beams reflected with the galvano-scan mirror, and the ceramic green sheet so as to be arranged in a predetermined position; allowing the laser beam emitted from the laser source to pass through the diffraction grating; splitting the pulse laser beam into plural laser beams having such an energy that allows the beams to perforate through the ceramic green sheet but not to perforate through the carrier film; reflecting the split plural pulse laser beams with the galvano-scan mirror to irradiate the beams onto one face of the ceramic green sheet not supported with the carrier film to form a plurality of feedthrough holes on the ceramic green sheet; repeatedly irradiating the laser beam onto one face of the ceramic green sheet not supported with the carrier film by changing the reflection angle of the galvano-scan mirror to form a plurality of the feedthrough holes within a different area on the ceramic green sheet.

The laser beam is repeatedly irradiated onto one face of the ceramic green sheet not supported with the carrier film by changing the reflection angle of the galvano-scan mirror. Consequently, a plurality of the feedthrough holes can be efficiently formed at plural sites within a desired area on the ceramic green sheet so as not to perforate through the carrier film without allowing the ceramic green sheet to travel, thereby making the present invention more practical.

After splitting the laser beam into plural laser beams having an energy that allows the beams to perforate through the ceramic green sheet but not to perforate through the carrier film by allowing the laser beam to pass through the diffraction grating, the split laser beams may be irradiated onto the ceramic green sheet by allowing the beams to reflect with the galvano-scan mirror in the method for machining a ceramic green sheet according to the present invention. Otherwise, after allowing the laser beam to reflect with the galvano-scan mirror, the laser beam may be allowed to pass through the diffraction grating to split the beam into plural laser beams, whereby the same effect as obtained in the foregoing aspects of the present invention may be obtained.

The pulse laser beam may be repeatedly irradiated while allowing the ceramic green sheet to travel in the method for machining a ceramic green sheet according to the present invention.

The laser beam is repeatedly irradiated onto the ceramic green sheet by changing the reflection angle with the galvano-scan mirror in the present invention as hitherto described. Besides that method, by allowing the ceramic green sheet to travel a plurality of the feedthrough holes can be securely formed on any areas of the ceramic green sheet so as not to perforate through the carrier film without imposing any positional restrictions, thereby making the present invention more practical.

In a further different aspect, the present invention provides an apparatus for machining a ceramic green sheet comprising: a support member for supporting the ceramic green sheet one face of which is supported with a carrier film; a travel member for allowing the ceramic green sheet to travel along a given direction; a laser source for emitting a pulse laser beam; a diffraction grating for allowing the laser beam emitted from the laser source to pass through and splitting the laser beam into plural laser beams having an energy that allows the beams to perforate through the ceramic green sheet but not to perforate through the carried film; and a converging lens for individually converging the laser beams split into plural beams to irradiate the laser beams onto the face of the ceramic green sheet not supported with the carrier film.

A machining apparatus to be used in the present invention comprises the support member for supporting the ceramic green sheet one face of which is supported with the carrier film, the travel member for allowing the ceramic green sheet to travel along a given direction, the laser source for emitting the pulse laser beam, the diffraction grating for splitting the laser beam into plural laser beams having a given energy by allowing the laser beam to pass therethrough, and the converging lens for individually converging the plural split laser beam to irradiate the laser beams onto the ceramic green sheet. Consequently, the ceramic green sheet may be efficiently machined to form a plurality of the feedthrough holes on the ceramic green sheet so that the holes do not perforate through the carrier film.

In a further different aspect, the present invention provides an apparatus for machining a ceramic green sheet, comprising: a support member for supporting the ceramic green sheet one face of which is supported with a carrier film; a laser source for emitting a pulse laser beam; a diffraction grating for allowing the laser beam emitted from the laser source to pass through and splitting the laser beam into plural laser beams having an energy that allows the beams to perforate through the ceramic green sheet but not to perforate through the carrier film; a galvano-scan mirror for reflecting at a given reflection angle each laser beam after passing through the diffraction grating and being split into plural beams; a galvano-mirror driving member for changing the reflection angle of the galvano-scan mirror; and a converging lens for individually converging the laser beams split into plural beams after being reflected with the galvano-scan mirror at a given angle and irradiating the laser beams onto one face of the ceramic green sheet that is not supported with the carrier film.

The split laser beams after passing through the diffraction grating are irradiated onto the ceramic green sheet by allowing the beams to reflect with the galvano-scan mirror, followed by repeatedly irradiating the laser beams onto the ceramic green sheet by changing the reflection angle of the galvano-scan mirror. Consequently, a plurality of the feedthrough holes can be efficiently formed at plural sites within a desired area on the ceramic green sheet so as not to perforate through the carrier film without allowing the ceramic green sheet to travel, thereby making the present invention more practical.

In addition, the machining apparatus may be constructed so that the laser beam reflected at an given angle with the galvano-scan mirror is split with the diffraction grating to irradiate the beams onto the ceramic green sheet, followed by repeatedly irradiating the laser beams onto the ceramic green sheet by changing the reflection angle of the galvano-scan mirror. Consequently, a plurality of the feedthrough holes can be efficiently formed at plural sites within a desired area on the ceramic green sheet so as not to perforate through the carrier film without allowing the ceramic green sheet to travel, thereby making the present invention more practical.

The apparatus for machining a ceramic green sheet according to the present invention may comprise a travel member for allowing the ceramic green sheet to travel along a given direction.

The laser beam is repeatedly irradiated onto the ceramic green sheet by changing the reflection angle with the galvano-scan mirror. Otherwise, a plurality of the feedthrough holes may be efficiently formed at plural sites within a desired area on the ceramic green sheet so as not to perforate through the carrier film by allowing the ceramic green sheet to travel, thereby making the present invention to be more practical.

DESCRIPTION OF THE PREFERRED EMBODIMENT

The features of the present invention will be described in more detail with reference to the embodiments.

First Embodiment

Figure 1:
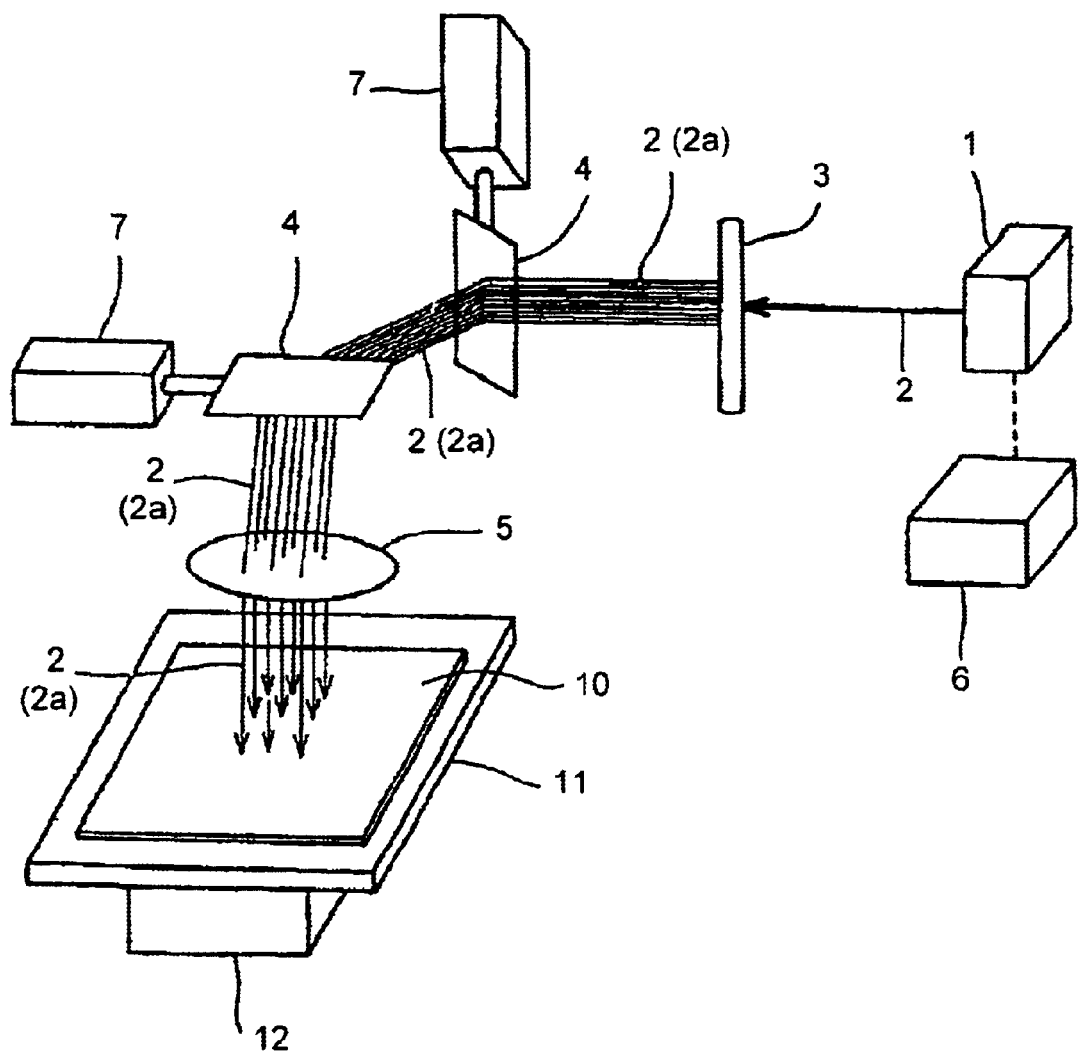
FIG. 1 illustrates an apparatus for machining a ceramic green sheet according to one embodiment of the present invention.
Figure 2:
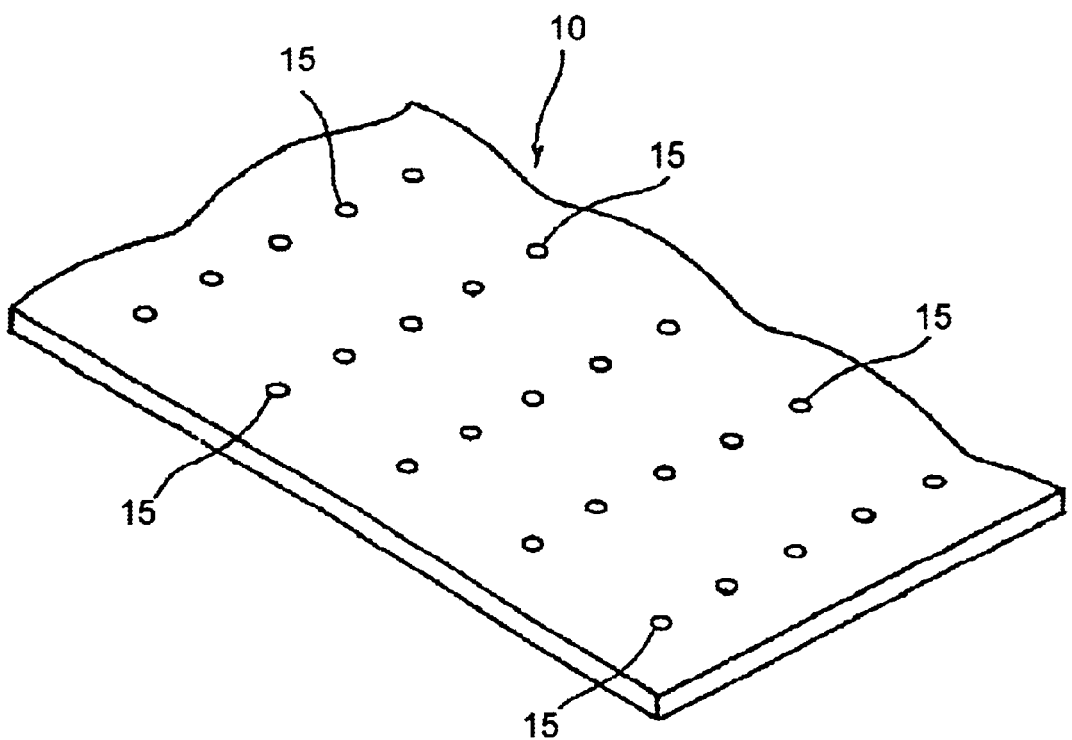
FIG. 2 shows a ceramic green sheet on which feedthrough holes are formed by machining the ceramic green sheet using the machining apparatus shown in FIG. 1 according to one embodiment of the present invention.

FIG. 1 illustrates an apparatus for machining a ceramic green sheet according to one embodiment of the present invention. FIG. 2 shows a ceramic green sheet on which feedthrough holes are formed using the machining apparatus shown in FIG. 1.

Described in this embodiment is an example in which a ceramic green sheet to be used for manufacturing a laminated coil component is machined into a sheet on which feedthrough holes 15 having a circular plane view. The feedthrough holes 15 serve as via-holes in the product (laminated coil component).

As shown in FIG. 1, the machining apparatus used in this embodiment comprises, a support member an XY-table 11 in this embodiment) supporting the ceramic green sheet and being capable of moving the ceramic green sheet 10 along a given direction, a laser source 1, a diffraction grating 3 for allowing the laser beam 2 emitted from the laser source 1 to pass though to split the beam into plural laser beams having a shape corresponding to the shape of the feedthrough holes 15 (FIG. 2) to be formed on the ceramic green sheet 10, a galvano-scan mirror 4 for allowing the split laser beam 2 after passing the diffraction grating 3 to reflect at a given angle, and a converging lens 5 for individually converging the laser beams 2 reflected with the galvano-scan mirror 4 at the given angle. The converged laser beams after passing through the converging lens 5 are irradiated onto the ceramic green sheet 10 on the XY-table 11.

The machining apparatus further comprises a laser source driving member 6 for driving the laser source 1, a galvano-scan mirror driving member 7 for changing the reflection angle of the galvano-scan mirror 4, and a table driving member (travel member) 12 for allowing the ceramic green sheet 10 supported on the XY-table to travel along a given direction.

A laser source emitting a $CO_2$ laser having a short pulse width is used for the laser source 1 in this machining apparatus. ZnSe having a small absorbance against the $CO_2$ laser is used for the diffraction grating 3, galvano-scan mirror 4 and converging lens 5.

The diffraction grating 3 in this machining apparatus is so constructed as to be able to split the laser beam 2 into plural beams so that the beams have an approximately circular plane view (the shape on the irradiation plane).

Next, the method for forming feedthrough holes on the ceramic green sheet using the apparatus for machining the ceramic green sheet having the construction as described above will be described hereinafter.

1. A vinyl acetate based binder is added into a ceramic mainly composed of a NiCuZn ferrite, and is mixed for 17 hours with a ball-mill. The mixture is formed into a sheet by a doctor blade method to form the ceramic green sheet 10 with a thickness of 50 $\mu$m, which is placed on the support member 11.

2. The pulse laser beam 2 is emitted from the laser source 1 comprising a $CO_2$ laser oscillator with a rating output of 300 W for use in perforation. The pulse laser beam is allowed to pass through the diffraction grating 3 to split the beam into laser beams having a shape corresponding to the shape of the feedthrough holes 15 (see FIG. 2) to be formed on the ceramic green sheet 10 (the beam is split into 25 divisions of 5 (length) ×5 (breadth) beams in this embodiment). However, the laser beam may be split into various divisions such as 9 divisions of 3 (length)×3 (breadth) or 49 divisions of 7 (length)×7 (breadth) in the present invention.

3. The split pulse laser beams 2 are irradiated onto the ceramic green sheet 10 after allowing the beams to reflect with the galvano-scan mirror 4. A plurality of the feedthrough holes 15 (FIG. 2) are formed by removing desired sites on the ceramic green sheet 10. The feedthrough holes 15 with a circular plane view having a diameter of 50 μm were formed with a machining pitch of 1.2 mm×0.6 mm.

The laser beam 2 with an oscillation frequency of 1 kHz a pulse width of 50 μS (micro second) and a pulse energy of 1 mJ was used.

4. The ceramic green sheet 10 was repeatedly irradiated with the laser beam 2 by changing the reflection angle of the galvano-scan mirror 4 to form the feedthrough holes 15 (FIG. 2) within a different area on the ceramic green sheet 10.

5. The step for irradiating the ceramic green sheet 10 with the laser beam 2 by changing the reflection angle of the galvano-scan mirror 4 in the step 4 is repeated to form the feedthrough holes 15 in all the desired area on the ceramic green sheet 10 (the area capable of forming the feedthrough holes 15 within a different area by changing the reflection angle of the galvano-scan mirror). Subsequently, the steps 2 to 4 above are repeated while allowing the XY-table 11 to shift by a given distance to form a plurality of the feedthrough holes 15 at desired sites within the overall area on the ceramic green sheet 10.

According to the machining method and machining apparatus in this embodiment, a plurality of the feedthrough holes 15 (FIG. 2) are simultaneously formed on the ceramic green sheet 10 by irradiating the split laser beams 2 obtained by allowing the beam to pass through the diffraction grating 3 onto the ceramic green sheet 10. Accordingly, a plurality of the feedthrough holes 15 can be efficiently formed within a desired area on the ceramic green sheet 10 with a high energy efficiency without using any masks.

The minimum size (diameter), positional machining accuracy and machining rate of the feedthrough holes formed by the conventional method using a die and pin, by the conventional method using a shunt, and the method according to this embodiment described above are shown in TABLE 1.

machining rate is greatly improved to 7000 holes/sec as compared with the machining rate of 400 holes/sec in the conventional laser machining method using a shunt.

While an example for forming feedthrough holes with a circular plane view has been explained in this embodiment, the shape of the feedthrough holes is not particularly restricted in the present invention, but feedthrough holes having a variety of shapes such as rectangular, polygonal other than rectangular and elliptic shapes can be formed by changing the design pattern of the diffraction grating.

Although the case when the feedthrough holes are formed on the green sheet to be used for manufacturing a laminated coil component has been described in this embodiment, the present invention is not particularly restricted to the kind and use of the ceramic green sheet on which the feedthrough holes are formed, but can be widely applied for forming via-holes on the ceramic green sheet for use, for example, in laminated substrates.

While the $CO_2$ laser is used in this embodiment, other kind of lasers may be used in the present invention.

While the pulse laser beam is used in this embodiment, it is possible to use laser beams other than the pulse laser beams in the present invention.

Although the ceramic green sheet is machined by directly mounting it on the XY-table 11 (the support member), it is possible to process the ceramic green sheet supported on the carrier film by mounting it on the support member together with the carrier film. When the ceramic green sheet provided with the carrier film is processed; dimensional accuracy and positional accuracy of the feedthrough holes can be improved by suppressing deformation and distortion of the ceramic green sheet because the ceramic green sheet is handled while it is supported with the carrier film.

Second Embodiment

Figure 3:
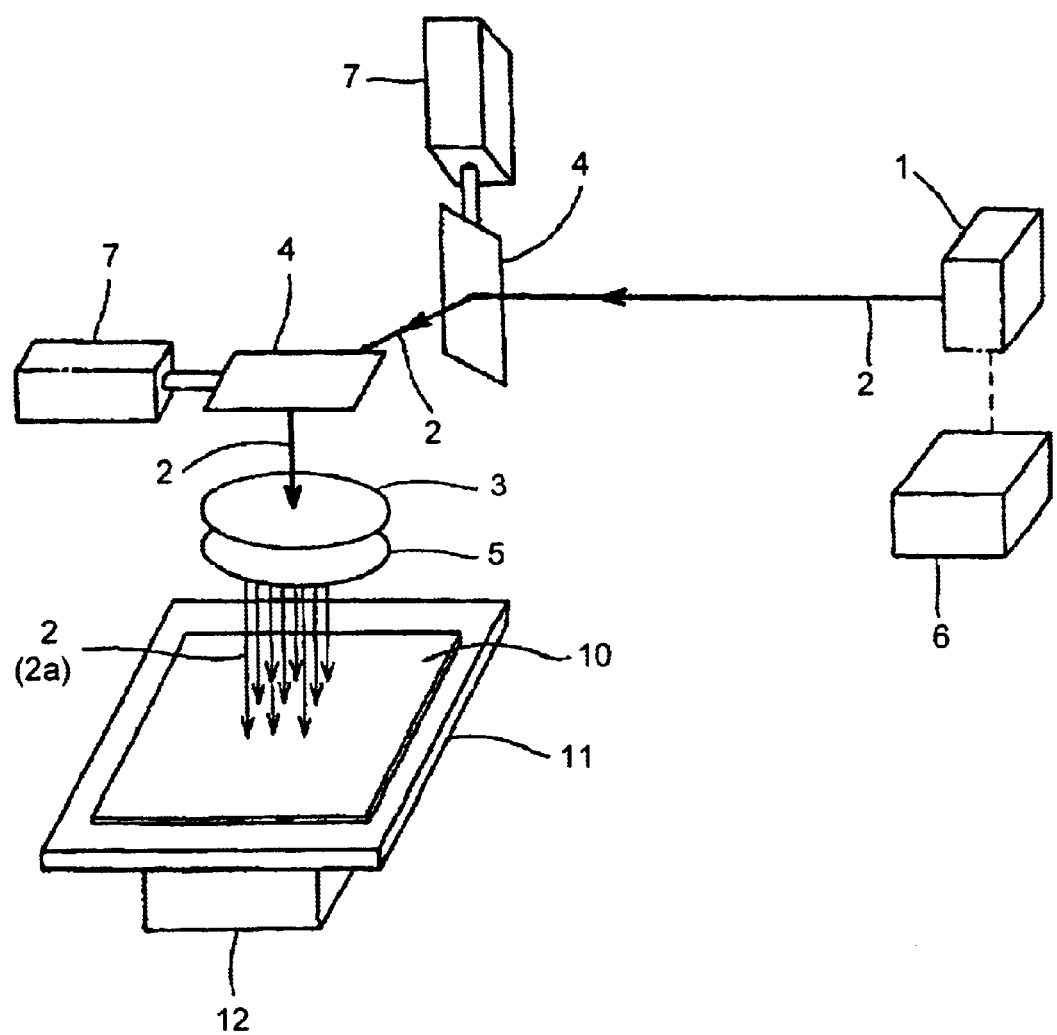
FIG. 3 illustrates an apparatus for machining a ceramic green sheet according to an another embodiment of the present invention.
Figure 4:
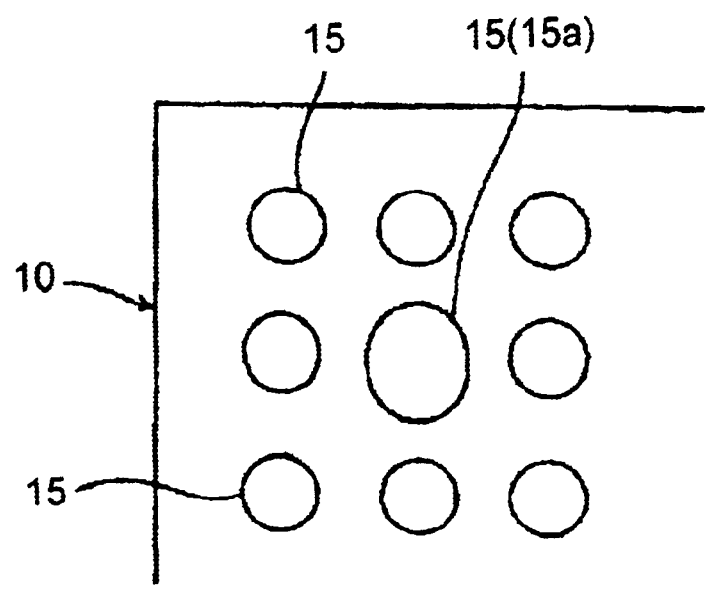
FIG. 4 shows a plan view illustrating the shape of feedthrough holes when the feedthrough holes are formed on the ceramic green sheet using laser beams split into plural beams with a conventional diffraction grating.
Figure 5:
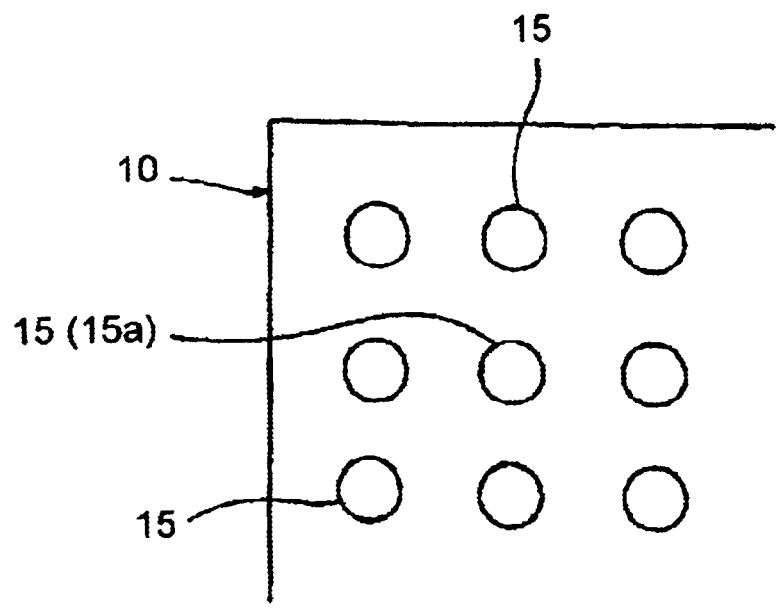
FIG. 5 provides a method for arranging the disposition of the diffraction grating, illustrating a plan view of the shapes of the feedthrough holes when the feedthrough holes are formed using a laser beam adjusted so that the laser beam at the center has the same energy as the laser beams at the periphery.
Figure 6:
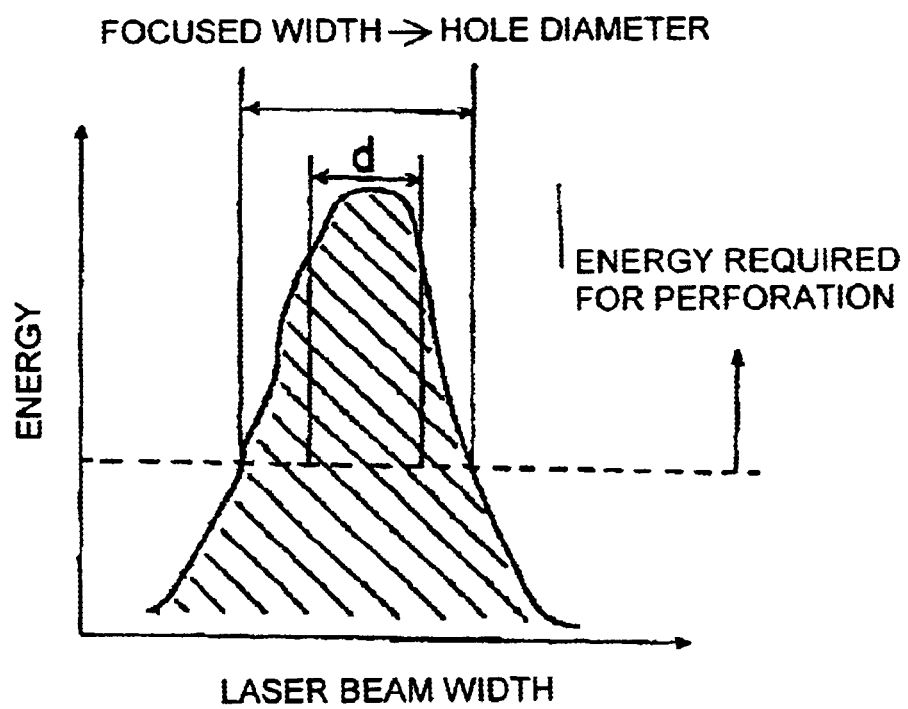
FIG. 6 is a graph showing the relation between the output (energy) of the laser oscillator and the width of the laser beam.
Figure 7:
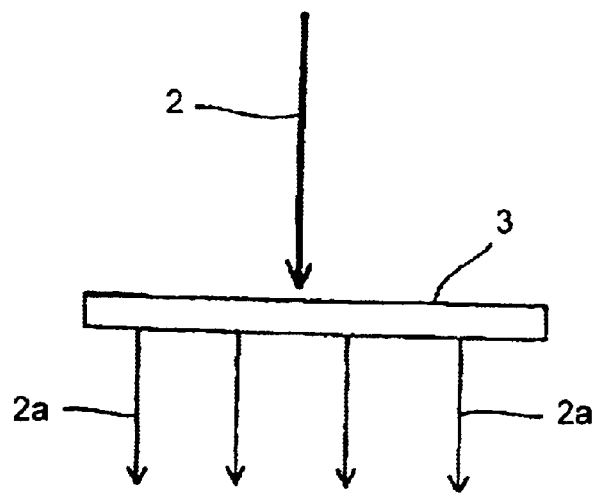
FIG. 7 shows how the laser beam having a high energy level is split into plural beams using a diffraction grating.
Figure 8A:
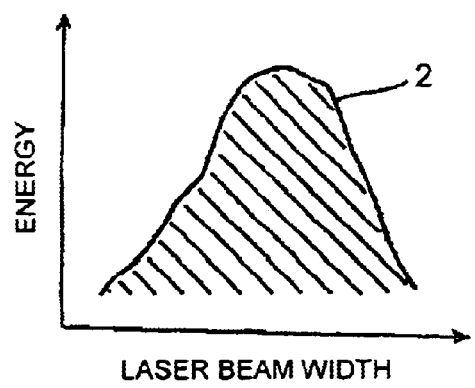
FIG. 8A is a graph showing the relation between the energy and width of the laser beam before splitting the beam using a diffraction grating.
Figure 8B:
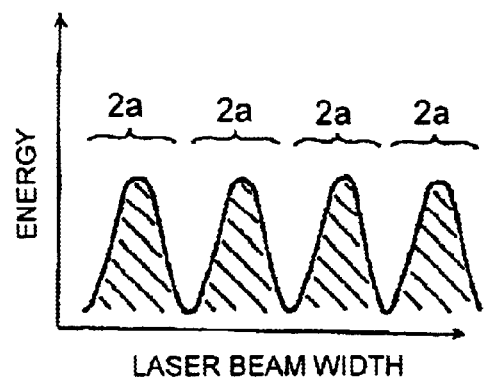
FIG. 8B is a graph showing the relation between the energy and width of the laser beam after splitting the beam using a diffraction grating.

FIG. 3 illustrates an apparatus for machining a ceramic green sheet according to an another embodiment of the present invention.

The machining apparatus in this embodiment is configured so that a laser beam 2 is split into plural beams by passing through a diffraction grating 3 after being reflected with a galvano-scan mirror 4 in advance.

The machining apparatus 2 in the second embodiment is constructed by the same way as used in the machining apparatus in the first embodiment, except that the diffraction grating 3 is placed between the galvano-scan mirror 4 and a

TABLE 1

|  | CONVENTIONAL MACHINING METHOD USING A DIE AND PIN | CONVENTIONAL LASER MACHINING METHOD | MACHINING METHOD ACCORDING TO THE FIRST EMBODIMENT |
|---|---|---|---|
| MINIMUM SIZE OF FEEDTHROUGH HOLE AVAILABLE (μm) | 100 | 25 | 25 |
| POSITIONAL MACHINING ACCURACY (μm) | 50 | 20 | 20 |
| MACHINING RATE (HOLES/SEC) | 5000 | 400 | 7000 |

TABLE 1 shows that fine and uniform feedthrough holes can be formed with higher machining accuracy and machining rate by the machining method (machining apparatus) according to this embodiment, than by the conventional machining method using a die and pin. In addition, the converging lens 5. Since the method for machining the ceramic green sheet 2 using the machining apparatus as described above is similar to the method as used in the first embodiment, detailed descriptions thereof are omitted herein. In FIG. 3, the portions given the same reference numerals as used in FIG. 1 denote the portions corresponding to those in FIG. 1.

The same effects as obtained in the first embodiment can be also obtained when the ceramic green sheet is machined using the machining apparatus as shown in FIG. 3.

Third Embodiment

As shown in FIG. 1, the machining apparatus used in this embodiment comprises: a support member (an XY-table 11 in this embodiment) supporting a ceramic green sheet 10 and being constructed so that the ceramic green sheet 10 is allowed to travel along a given direction; a laser source 1; a diffraction grating 3 for allowing a laser beam 2 emitted from the laser source 1 to pass through to split the beam into plural laser beams having a uniform shape and size corresponding to the shape and size of feedthrough holes 15 (FIG. 2) to be formed on the ceramic green sheet 10; a galvano-scan mirror 4 for allowing the laser beam 2 after passing through the diffraction grating 3 and evenly split into plural beams to reflect at a given angle; and a converging lens 5 for individually converging the laser beam 2 reflected at a given angle with the galvano-scan mirror 4. The laser beams converged by passing through the converging lens 5 is irradiated onto the ceramic green sheet 10 on the XY-table 11.

The diffraction grating 3 used in the machining apparatus, in this embodiment is constructed to be able to split the laser beam into plural beams having a uniform shape and size so that the laser beams irradiated at the center among the laser beams split into plural beams may have the same energy as the laser beams irradiated at the periphery of the ceramic green sheet. Accordingly, the feedthrough holes formed at the center portion never turns out to be larger than the feedthrough holes formed at the periphery, thereby enabling securely forming a plurality of the feedthrough holes having a uniform shape and size.

The plural feedthrough holes having a uniform shape and size are formed on the ceramic green sheet by the same method as used in the first embodiment using the apparatus for machining the ceramic green sheet constructed as described above.

According to the machining apparatus and machining method in this embodiment, a plurality of the feedthrough holes 15 (FIG. 2) having a uniform shape and size are simultaneously formed on the ceramic green sheet 10 by irradiating the plural laser beams 2, having a uniform shape and size and being split into plural beams by passing through the diffraction grating 3, onto the ceramic green sheet. Therefore, a plurality of the feedthrough holes 15 having a uniform shape and size can be efficiently formed with a high energy efficiency within a desired area on the ceramic green sheet 10 without using a mask. The same effects as shown in TABLE 1 are also obtained in this embodiment.

Fourth Embodiment

FIG. 3 illustrates an apparatus for machining a ceramic green sheet according to an another embodiment of the present invention.

The machining apparatus in the embodiment is constructed so that a laser beam 2 is split into plural beams having a uniform shape and size by passing through a diffraction grating 3 after the beam is previously reflected with a galvano-scan mirror 4.

The machining apparatus according to the fourth embodiment is constructed by the same way as used in the third embodiment, except that the diffraction grating 3 is placed between the galvano-scan mirror 4 and the converging lens 5. The method for machining the ceramic green sheet using the machining apparatus as described above is also similar to the method used in the third embodiment. Accordingly, the explanations for the corresponding portions in the third embodiment are also applied to this embodiment, and detailed descriptions thereof are omitted. The portions in FIG. 3 given the same reference numerals as in FIG. 1 denote the same as or corresponding to the portions in FIG. 1.

The same effects as obtained in the third embodiment can be also obtained in this embodiment when the ceramic green sheet is machined using the machining apparatus shown in FIG. 3.

Fifth Embodiment

The case, when fine holes 15 with a circular plane view as shown in FIG. 2 are formed by machining a ceramic green sheet to be used for manufacturing a laminated coil component, is described in this embodiment as an example. While the fine holes 15 is destined to serve as via-holes in the product (laminated coil component), the fine holes having a hole diameter of 50 µm and 30 µm were formed in this embodiment.

As shown in FIG. 1, the machining apparatus used in this embodiment comprises: a support member (an XY-table 11 in this embodiment) for supporting a ceramic green sheet 10 and being constructed so that the ceramic green sheet 10 is allowed to travel along a given direction; a laser source 1; a diffraction grating 3 for allowing a laser beam 2 emitted from the laser source 1 to pass through to split the beam into plural laser beams 2a having an energy suitable for forming the fine holes 15 (FIG. 2) with a hole diameter of 50 µm or less (50 µm and 30 µm in this embodiment); a galvano-scan mirror 4 for allowing the plural split laser beams 2a after passing through the diffraction lattice 3 to reflect at a given angle; and a converging lens 5 for individually converging the laser beams 2a reflected at a given angle with the galvano-scan mirror 4. The laser beams converged by passing through the converging lens 5 is irradiated onto the ceramic green sheet 10 on the XY-table 11.

The fine holes are formed on the ceramic green sheet by the same method as in the first embodiment using the apparatus for machining the ceramic green sheet.

According to the machining apparatus and machining method in this embodiment, a plurality of the fine holes 15 (FIG. 2) are simultaneously formed on the ceramic green sheet 10 by irradiating plural laser beams 2a, which have an energy suitable for forming the fine holes 15 (FIG. 2) with a hole diameter of 50 µm and 30 µm on the ceramic green sheet 10, onto the ceramic green sheet 10. Accordingly, the fine holes can be efficiently formed with high positional accuracy and configurational accuracy within a desired area on the ceramic green sheet 10.

Variations of the hole diameters and roundness of the fine holes formed by conventional the laser machining method in which the output of the laser oscillator is adjusted, and formed by the method according to this embodiment, are compared in TABLE 2 and TABLE 3.

TABLE 2 shows the data when the fine holes with a hole diameter of 50 µm are formed. TABLE 3 shows the data when the fine holes with a hole diameter of 30 µm are formed.

TABLE 2

| | VARIATIONS OF HOLE DIAMETER (%) (HOLE DIAMETER 50 μm) | ROUNDNESS (%) (HOLE DIAMETER 50 μm) |
|---|---|---|
| CONVENTIONAL LASER MACHINING METHOD (BY ADJUSTING OUTPUT OF LASER OSCILLATOR) | 30 | 75 |
| LASER MACHINING METHOD IN THE PRESENT EMBODIMENT (SPLITTING USING DIFFRACTION GRATING) | 5 | 98 |

TABLE 3

| | VARIATIONS OF HOLE DIAMETER (%) (HOLE DIAMETER 30 μm) | ROUNDNESS (%) (HOLE DIAMETER 30 μm) |
|---|---|---|
| CONVENTIONAL LASER MACHINING METHOD (BY ADJUSTING OUTPUT OF LASER OSCILLATOR) | 80 | 20 |
| LASER MACHINING METHOD IN THE PRESENT EMBODIMENT (SPLITTING USING DIFFRACTION GRATING) | 10 | 95 |

TABLE 2 and TABLE 3 show that the fine holes having small variations of the hole diameters and high degree of roundness (i.e. a shape of circle is not distorted) can be formed using the machining method (machining apparatus) of this embodiment.

Sixth Embodiment

FIG. 3 illustrates an apparatus for machining a ceramic green sheet according to an another embodiment of the present invention.

The machining apparatus in this embodiment is constructed so that a laser beam 2 is split into plural laser beams 2a having an energy suitable for forming fine holes 15 (FIG. 2) having a hole diameter of 50 μm or less by passing through a diffraction grating 3 after being previously reflected with a galvano-scan mirror 4.

The machining apparatus in the sixth embodiment has the same construction as the machining apparatus used in the fifth embodiment, except that the diffraction grating 3 is placed between the galvano-scan mirror 4 and a converging lens 5. Since the method for machining the ceramic green sheet using such machining apparatus as described above is the same as the apparatus used in the fifth embodiment, the explanations corresponding to the portions in the fifth embodiment are also applied in this embodiment, and detailed descriptions thereof are omitted.

The same effects as obtained in the fifth embodiment can be also obtained when the ceramic green sheet is machined using the machining apparatus in FIG. 3.

Seventh Embodiment

Figure 9:
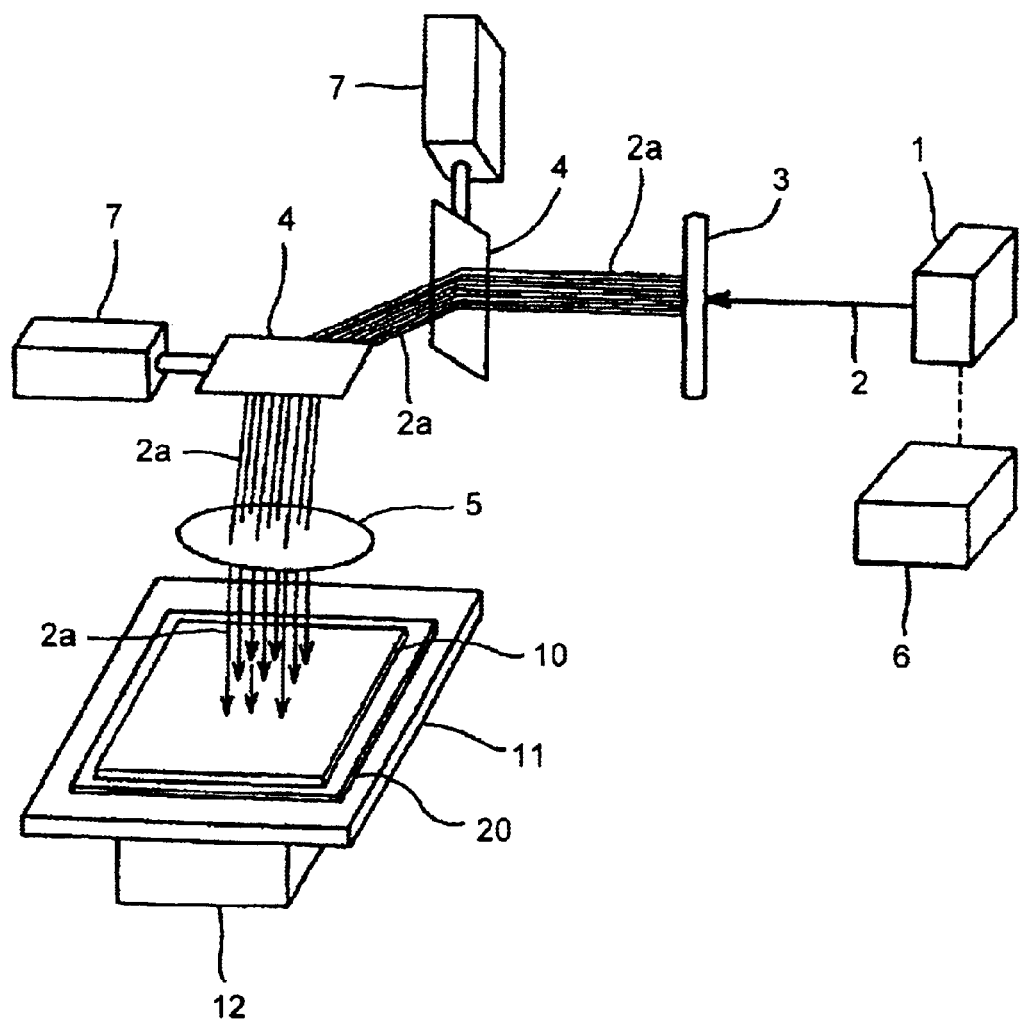
FIG. 9 illustrates the construction of an apparatus for machining a ceramic green sheet according to one embodiment of the present invention.

FIG. 9 illustrates an apparatus for machining a ceramic green sheet according to one embodiment of the present invention.

As shown in FIG. 9, the machining apparatus used in this embodiment comprises a support member (an XY-table 11 in this embodiment) for supporting the ceramic green sheet 10 one face (lower face) of which is supported with a carrier film 20 while allowing the ceramic green sheet 10 to travel along a given direction; a laser source 1 for emitting a pulse laser beam; a diffraction grating 3 for allowing a laser beam 2 emitted from the laser source 1 to pass through to split the beam into plural laser beams 2a having an energy that is able to remove desired sites on the ceramic green sheet 10 to form feedthrough holes 15 (FIG. 10B), and forming non-perforated plugged holes 20a (or without forming feedthrough, completely penetrating holes), on the carrier film 20 by removing only a part of the carrier film 20; a galvano-scan mirror 4 for allowing the split laser beams 2a after passing through the diffraction grating 3 to reflect at a given angle; and a converging lens 5 for individually converging the laser beams 2a reflected with the galvano-scan mirror 4 at the given angle. The laser beams converged by passing through the converging lens 5 are irradiated onto one face (the upper face) of the ceramic green sheet 10 not supported with the carrier film 20 on the XY-table 11.

Figure 10A:
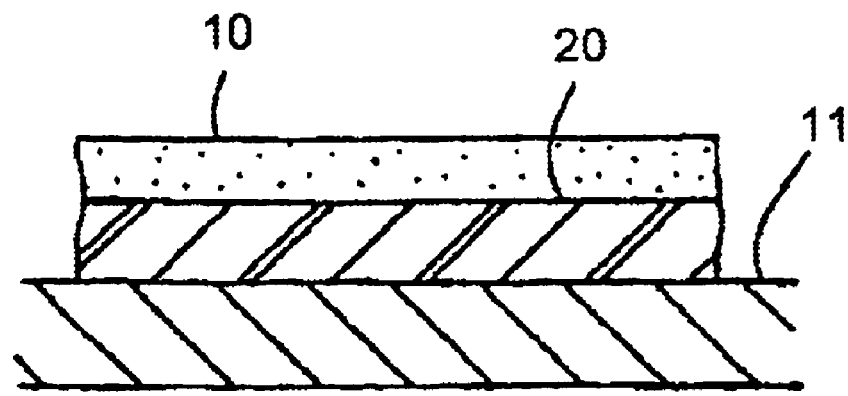
FIG. 10A is provided for describing the method for machining a ceramic green sheet using the machining apparatus shown in FIG. 9 according to one embodiment of the present invention, which is a cross section before machining.

Next, the method for forming the feedthrough holes on the ceramic green sheet 10, one face of which is supported with the carrier film 20, using the apparatus for machining the ceramic green sheet having the construction as described above will be described with reference to FIGS. 9, 10A and 10B.

1. A vinyl acetate based binder is added to a ceramic mainly composed of a NiCuZn ferrite. After mixing with a ball-mill, the mixture is formed into a sheet with a thickness of 25 μm on a carrier film 20 with a thickness of 50 μm made of PET to form a ceramic green sheet 10. The ceramic green sheet 10 with the carrier film 20 is then mounted on a support member (XY-table) 11.

2. A pulse laser beam 2 is emitted from the laser source 1 provided in a $CO_2$ laser oscillator (FIG. 9) for perforation with a rating output of 300 W. The pulse laser beam 2 is allowed to pass through a diffraction grating 3. The beam is split into plural laser beams 2a having an energy that is able to remove desired sites on the ceramic green sheet 10 to form feedthrough holes 15 (FIG. 10B), and forming non-perforated plugged holes 20a (or without forming feedthrough holes) on the carrier film 20 by removing only a part of the carrier film 20.

Figure 10B:
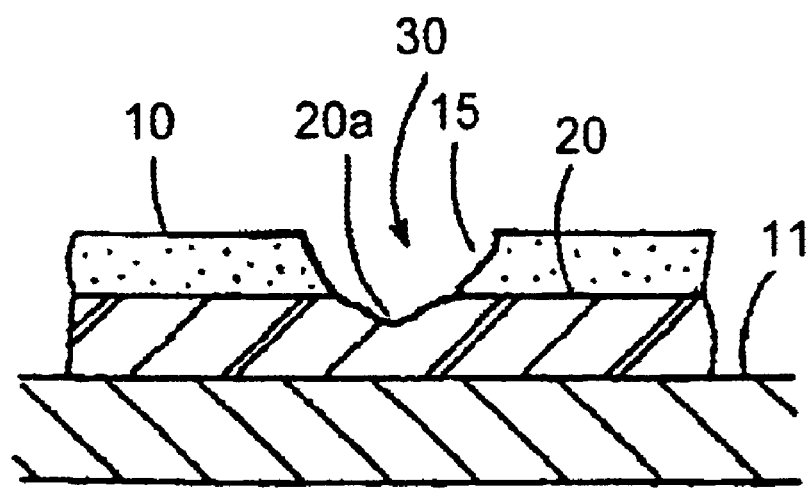
FIG. 10B which is provided for describing the method for machining a ceramic green sheet using the machining apparatus shown in FIG. 9 according to one embodiment of the present invention, is a cross section after forming feedthrough holes on the ceramic green sheet and plugged holes on the carrier film after machining.

3. The split pulse laser beam 2a is reflected with a galvano-scan mirror 4 and irradiated onto one face (upper face) of the ceramic green sheet 10, which indicates a side not supported with the carrier film 20, to form holes 30 that perforate through the ceramic green sheet 10 and reach the midway of the carrier film 20 (the holes 30 are composed of the feedthrough holes 15 formed on the ceramic green sheet 10 and plugged holes 20a formed on the carrier film 20). As a result, desired sites on the ceramic green sheet 10 are removed to form the feedthrough holes 15 on the ceramic green sheet 10 as shown in FIG. 10B while forming the non-perforated plugged holes 20a (or a hollow portion is formed by removing a portion of the carrier film) on the carrier film 20.

4. The laser beam 2 is repeatedly irradiated onto the ceramic green sheet 10 by changing the reflection angle of the galvano-scan mirror 4 to form the feedthrough holes within a different area on the ceramic green sheet 10.

5. The step A for irradiating the ceramic green sheet 10 with the laser beam 2 by changing the reflection angle of the galvano-scan mirror 4 is repeated. After forming the feedthrough holes 15 within all the desired area (the area where the feedthrough holes 15 are able to be formed within a different area by changing the reflection angle of the galvano-scan mirror 4) on the ceramic green sheet 10, the XY-table 11 is shifted by a given distance, and a plurality of the feedthrough holes 15 are formed at all the desired sites on the ceramic green sheet 10 by repeating the steps 2 to 4.

According to the machining apparatus and machining method, the laser beams 2a split into plural beams after passing through the diffraction grating 3, which have such an energy that there are able to form the feedthrough holes 15 by removing the desired sites on the ceramic green sheet 10, and form the plugged holes 20a (hollow portions) on the carrier film 20 by removing only a part of the carrier film 20, are irradiated onto the ceramic green sheet 20 one face of which is supported with the carrier film 20. Accordingly, the feedthrough holes 15 can be securely and efficiently formed only on the ceramic green sheet 10 without as allowing the beams to perforate through the carrier film 20.

It was necessary in the conventional laser machining method to reduce the output level of the laser oscillator to 0.4 mJ for machining, and the proportion of the laser beams that are able to form the feedthrough holes only on the ceramic green sheet without perforating through the carrier film was 68%. In contrast according to the method described in the above embodiment, machining was possible by maintaining the output level of the laser oscillator at 2.3 mJ, and the proportion of the laser beams that are able to form the feedthrough holes only on the ceramic green sheet without perforating through the carrier film was 100%.

Next, after forming the feedthrough holes 15 only on the ceramic green sheet 10 and the non-perforated plugged holes 20a on the carrier film 20, a conductive paste is applied on the ceramic green sheet 10 to fill the holes with a predetermined pattern. Further the method for peeling the ceramic green sheet 10 from the carrier film 20 will be described hereinafter.

Figure 11:
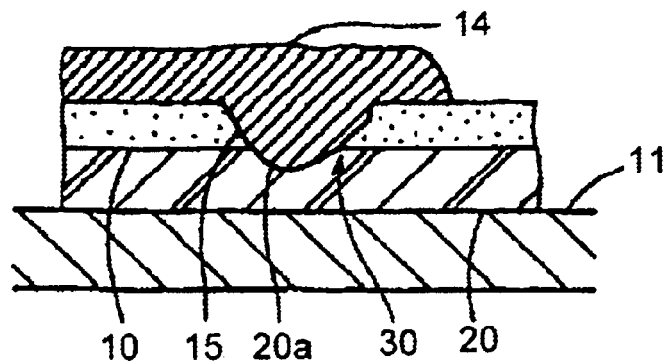
FIG. 11 is a cross section showing a ceramic green sheet provided with a carrier film in which a conductive paste is filled in the feedthrough holes.

As shown in FIG. 11 the conductive paste 14 is at first printed by screen printing within the area containing the feedthrough holes 15 on the ceramic green sheet 10 the lower face of which is supported with the carrier film 20 and which is supported on the XY-table 11 together with the carrier film 20. The conductive paste 14 is filled into the feedthrough holes 15 on the ceramic green sheet 10 and in the plugged holes 20a (hollow portions) on the carrier film 20.

Figure 12:
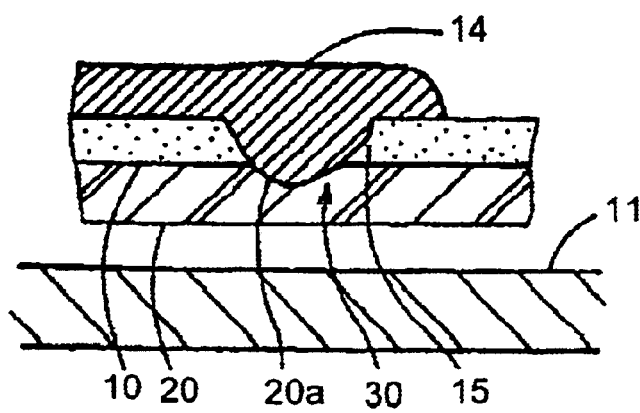
FIG. 12 is a cross section showing a ceramic green sheet provided with a carrier film which is lifted up from a XY-table.

Then, as shown in FIG. 12 while the ceramic green sheet 10 is lifted up from the XY-table 11 together with the carrier film 20, the conductive paste 14 is kept filled-in in the feedthrough holes 15 on the ceramic green sheet 10 and in the plugged holes 20a on the carrier film 20,.

Figure 13:
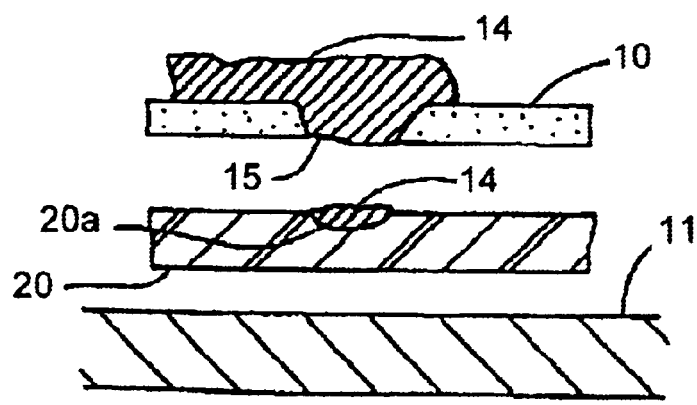
FIG. 13 shows a cross section of the ceramic green sheet peeled off from the carrier film.

In the following step as shown in FIG. 13, the ceramic green sheet 10 is peeled off from the carrier film 20. The conductive paste 14 is cut off at an interface between the portions where it is filled in the feedthrough holes 15 on the ceramic green sheet 10 and the portions where it is filled in the plugged holes 20a on the carrier film 20. Then the conductive paste 14 is securely filled into the feedthrough holes 15 on the ceramic green sheet 10. Consequently, a reliable electronic component in which the internal electrodes are securely connected with each other is obtained by laminating these ceramic green sheets.

While a pulse laser beam is used in the foregoing embodiments, laser beams other than the pulse laser beam may be used. While the examples in which the energy of the split laser beams were adjusted so that the beams perforate through the ceramic green sheet besides forming non-perforated plugged holes on the carrier film were described in the foregoing embodiments. In addition, the energy of the split laser beams may be adjusted in some cases so that the beams perforate through only the ceramic green sheet but do not form any feedthrough holes as well as plugged holes or hollow portions on the carrier film, thereby forming only the feedthrough holes on the ceramic green sheet.

Eighth Embodiment

Figure 14:
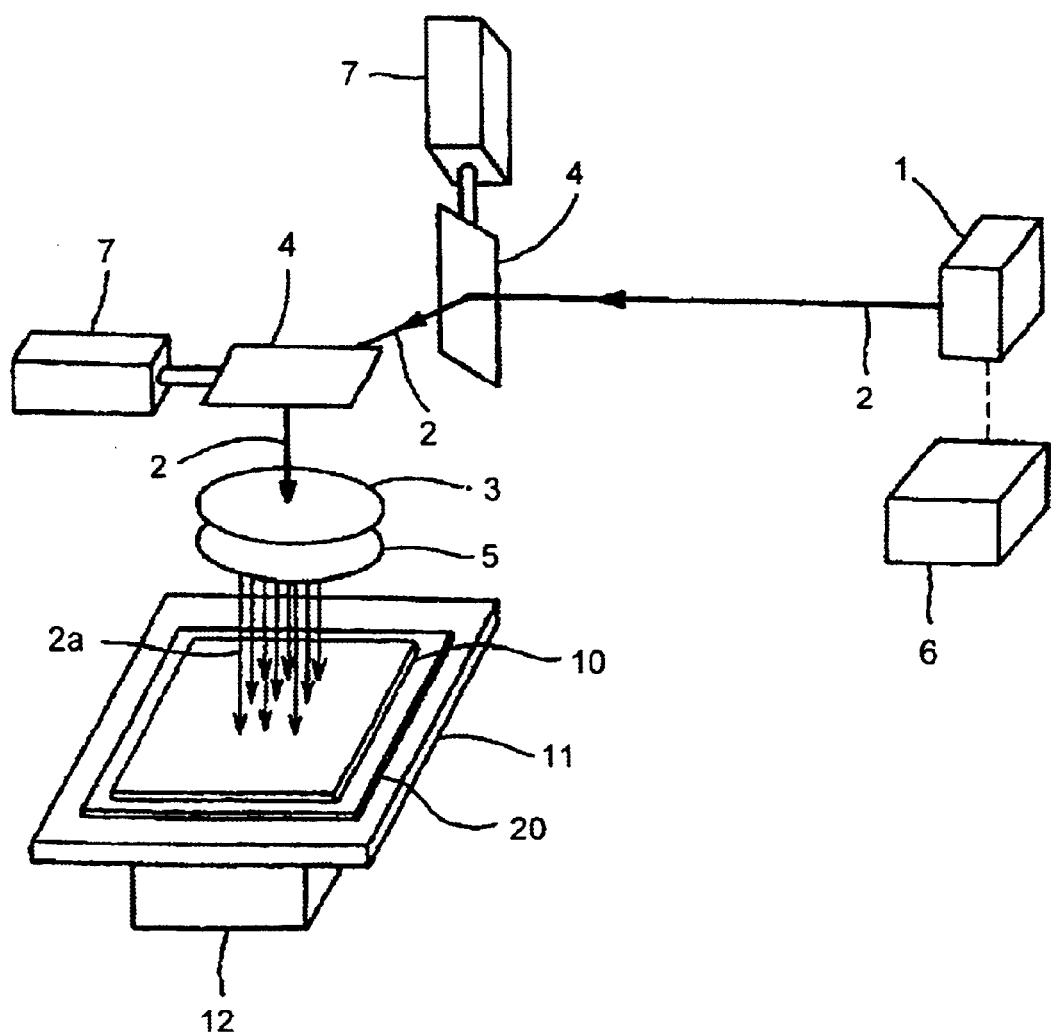
FIG. 14 illustrates an apparatus for machining a ceramic green sheet according to an another embodiment of the present invention.
Figure 15:
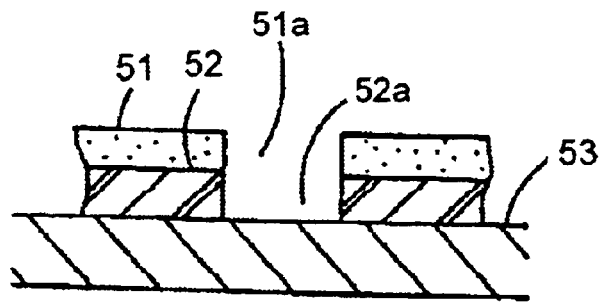
FIG. 15 shows a cross section of the ceramic green sheet on which feedthrough holes are formed.
Figure 16:
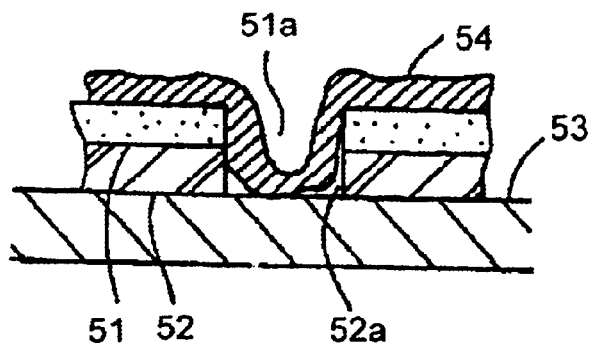
FIG. 16 shows a cross section when a conductive paste is printed on the ceramic green sheet on which feedthrough holes are formed by the conventional method.
Figure 17:
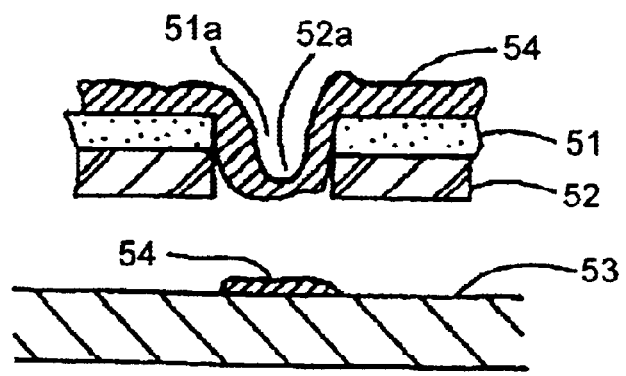
FIG. 17 shows a cross section when a ceramic green sheet is lifted up from the table together with a carrier film after printing a conductive film on the ceramic green sheet on which feedthrough holes are formed by the conventional method.
Figure 18:
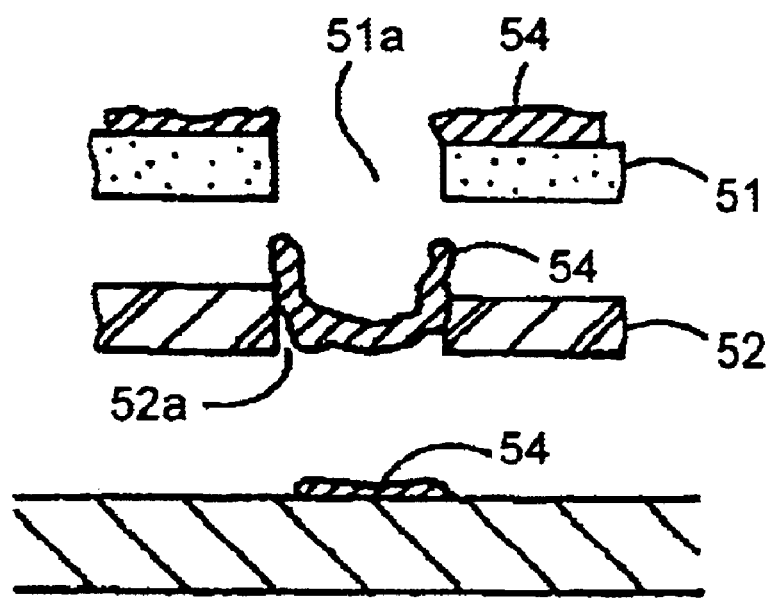
FIG. 18 shows a cross section when a ceramic green sheet on which a conductive paste is printed is peeled off from a carrier film.

FIG. 14 illustrates an apparatus for machining a ceramic green sheet according to an another embodiment of the present invention.

The machining apparatus in this embodiment is constructed so that after a laser beam 2 is reflected with a galvano-scan mirror 4 in advance, the laser beam 2 is allowed to pass through a diffraction grating 3 to split the beam into plural laser beams.

The machining apparatus in the eighth embodiment has the same construction as that used in the seventh embodiment, except that the diffraction grating 3 is placed between the galvano-scan mirror 4 and a converging lens 5. Since the method for machining the ceramic green sheet using the machining apparatus as described above is the same as the method used in the seventh embodiment, the explanations in the seventh embodiment are also applied in this embodiment, and descriptions thereof are omitted. The portions in FIG. 14 given the same reference numerals as those used in FIG. 9 denote the portions corresponding to those in FIG. 9.

The same effects as those obtained in the seventh embodiment can be also obtained when the ceramic green sheet is machined using the machining apparatus shown in FIG. 14.

What is claimed is:

1. A method for processing a ceramic green sheet to form a plurality of through holes in the ceramic green sheet, comprising the steps of:

(a) disposing a laser source for emitting a pulsed laser beam, a diffraction grating for splitting the laser beam into a plurality of laser beam components in the vicinity of the laser source, a galvano-scan mirror that reflects the laser beam components at a reflection angle, a converging lens that individually converges the laser beam components reflected by the galvano-scan mirror, and the ceramic green sheet, in a predetermined positional relationship;

(b) splitting the pulsed laser beam emitted from the laser source through the diffraction grating into the plurality of laser beam components;

(c) reflecting the plurality of laser beam components with the galvano-scan mirror toward the ceramic green sheet such that a plurality of through holes is simultaneously formed at predetermined locations of the ceramic green sheet;

(d) varying the reflection angle of the galvano-scan mirror to repeat said step (c) until the through holes are formed in an entire region that can be processed by such a variation of the reflection angle in the ceramic green sheet;

(e) shifting the ceramic green sheet by a predetermined distance and repeating said steps (c) and (d); and (f) repeating said step (e) until the through holes are formed at all predetermined locations of the ceramic green sheet.

2. The method according to claim 1, wherein the diffraction grating comprises a material having a high laser beam transmittance.

3. The method according to claim 1, wherein the laser beam is a $CO_2$ laser beam.

4. The method according to claim 1, wherein the ceramic green sheet is provided with a carrier film on one surface thereof.

5. The method according to claim 1, wherein each of the plurality of through holes has substantially the same shape and size.

6. A method for processing a ceramic green sheet, comprising:

(a) disposing a laser source for emitting a pulsed laser beam, a diffraction grating provided in the vicinity of the laser source for splitting the laser beam into a plurality of laser beam components that have energy suitable for forming fine holes having a diameter of about 50 μm or less on the ceramic green sheet, a galvano-scan mirror that reflects the laser beam components at a reflection angle, a converging lens that individually converges the laser beam components reflected by the galvano-scan mirror and the ceramic green sheet, in a predetermined positional relationship;

(b) splitting the pulsed laser beam emitted from the laser source through the diffraction grating into the plurality of laser beam components;

(c) reflecting the plurality of laser beam components with the galvano-scan mirror toward the ceramic green sheet such that a plurality of fine holes having a diameter of about 50 μm or less is simultaneously formed at predetermined locations of the ceramic green sheet;

(d) varying the reflect ion angle of the galvano-scan mirror to repeat said step (c) until the fine holes are formed in an entire region that can be processed by such a variation of the reflection angle in the ceramic green sheet;

(e) shifting the ceramic green sheet by a predetermined distance and repeating said steps (c) and (d); and (f) repeating said stop (e) until the fine holes having a diameter of 50 μm or less are formed at all predetermined locations of the ceramic green sheet.

7. The method according to claim 6, wherein the diffraction grating comprises a material having a high laser beam transmittance.

8. The method according to claim 6, wherein the laser beam is a $CO_2$ laser beam.

9. The method according to claim 6, wherein the ceramic green sheet is provided with a carrier film on one surface thereof.

10. The method for processing a ceramic green sheet to form a plurality of through holes in the ceramic green sheet, comprising the steps of:

(a) disposing a laser source for emitting a pulsed laser beam, a diffraction grating for splitting the laser beam into a plurality of laser beam components in the vicinity of the laser source, a galvano-scan mirror that reflects the laser beam components at a reflection angle, a converging lens that individually converges the laser beam components reflected by the galvano-scan mirror, and the ceramic green sheet, in a predetermined positional relationship;

(b) splitting the pulsed laser beam emitted from the laser source through the diffraction grating into the plurality of laser beam components;

(c) reflecting the plurality of laser beam components by the galvano-scan mirror toward the ceramic green sheet so that a plurality of through holes is simultaneously formed at predetermined locations of the ceramic green sheet;

(d) varying the reflection angle of the galvano-scan mirror to repeat said step (c) until the through holes are formed in the entire region that can be processed by such a variation of the reflection angle in the ceramic green sheet;

(e) shifting the ceramic green sheet by a predetermined distance and repeating said steps (c) and (d); and (f) repeating said step (e) until the through holes are formed at all predetermined locations of the ceramic green sheet;

wherein the ceramic green sheet is provided with a carrier film on one surface thereof;

wherein the plurality of laser beam components has an energy that allows each of the plurality of laser beam components to penetrate through the ceramic green sheet but not to penetrate through the carrier film.

11. The method according to claim 10, wherein the diffraction grating comprises a material having a high laser beam transmittance.

12. The method according to claim 10, wherein the laser beam is a $CO_2$ laser beam.

13. The method according to claim 10, wherein each of the plurality of through holes has substantially the same shape and size.

* * * * *